(12) United States Patent
Ikuta et al.

(10) Patent No.: US 7,535,137 B2
(45) Date of Patent: May 19, 2009

(54) ALTERNATOR

(75) Inventors: Hiroya Ikuta, Tokyo (JP); Wakaki Miyaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/522,350

(22) Filed: Sep. 18, 2006

(65) Prior Publication Data

US 2007/0262680 A1 Nov. 15, 2007

(30) Foreign Application Priority Data

May 12, 2006 (JP) .............................. 2006-133727

(51) Int. Cl.
 H02K 19/00 (2006.01)
 H02K 5/24 (2006.01)
 H02K 11/04 (2006.01)
(52) U.S. Cl. ...................................... 310/68 D; 310/51
(58) Field of Classification Search .................. 310/51, 310/71, 179, 68 D
 See application file for complete search history.

(56) References Cited

U.S. PATENT DOCUMENTS

| 3,866,072 A | * | 2/1975 | Nagai | 310/68 D |
| 3,895,247 A | * | 7/1975 | Iwata et al. | 310/68 D |
| 5,686,780 A | * | 11/1997 | Adachi et al. | 310/68 D |
| 6,528,912 B2 | * | 3/2003 | Asao | 310/68 D |
| 6,911,758 B2 | * | 6/2005 | Oohashi | 310/179 |
| 6,936,941 B2 | * | 8/2005 | Oohashi et al. | 310/68 D |

FOREIGN PATENT DOCUMENTS

WO WO 2006-033136 3/2006

* cited by examiner

Primary Examiner—Burton Mullins
(74) Attorney, Agent, or Firm—Sughrue Mion, PLLC

(57) ABSTRACT

An automotive alternator includes: a case; a shaft; a rotor that is fixed to the shaft; a stator that is fixed to an inner wall surface of the case; and a rectifier apparatus that is disposed inside the case and that is electrically connected to a stator coil of the stator so as to rectify alternating current generated in the stator coil into direct current, the rectifier apparatus having: a heatsink; diodes; and a circuit board that connects the diodes and the stator coil electrically and that is fixed to the case so as to be supported together with the heatsink by mount portions at three points, the alternator being characterized in that: vibration suppressing portions that are thicker than the mount portions and that suppress generation of vibrational modes in the circuit board among the mount portions are disposed on the mount portions.

3 Claims, 5 Drawing Sheets

ALTERNATOR

BACKGROUND OF THE INVENTION

1. Field of the Invention

The present invention relates to an alternator that is mounted to a vehicle, for example, and that includes a rectifier apparatus that rectifies alternating current that is generated in a stator coil of a stator into direct current.

2. Description of the Related Art

Conventional automotive alternators are known that include: a case; a shaft that is rotatably supported in the case; a rotor that is fixed to the shaft; a stator that is constituted by: a stator core that is fixed to an inner wall surface of the case; and a stator coil that is configured by winding conducting wire onto the stator core; and a rectifier apparatus that is disposed inside the case and that is electrically connected to the stator coil so as to rectify alternating current generated in the stator coil into direct current, the rectifier apparatus having: a heatsink; a plurality of diodes that are fixed to the heatsink; and a circuit board that connects the diodes and the stator coil electrically and that is fixed to the case so as to be supported together with the heatsink by mount portions at three points at a uniform pitch (see Patent Literature 1, for example).

[Patent Literature 1]
International Publication No. 2006/033136 (Pamphlet: FIG. 4)

In recent years, additional increases in output are being required of automotive alternators, which constitute electrical components mounted to vehicles, and reductions in size are also required in order to meet increased density in engine compartments. The service environments thereof are also severe, naturally making it desirable to include high product performance such as environmental resistance, vibration resistance, etc.

In automotive alternators that have the above configuration, although the circuit board is fixed to the case by three mount portions, terminals between each of the mount portions are connected only to diode leads or connected to the stator coil.

Thus, because the circuit board substantially forms a bridge between the mount portions, vibrational modes arise easily and large vibrations act on the plurality of diodes leads that are connected to the terminals between each of the mount portions, leading to problems such as diode lead breakage, diode damage, etc., and in the worst cases, the rectifier apparatus itself may cease to function.

When attempts have been made to secure additional mount portions for the circuit board in response thereto, there have been problems such as the automotive alternator being increased in size.

SUMMARY OF THE INVENTION

The present invention aims to solve the above problems and an object of the present invention is to provide an alternator that can suppress vibration between mount portions of a circuit board by a simple construction without increasing size.

In order to achieve the above object, according to one aspect of the present invention, there is provided an alternator including: a case; a shaft that is rotatably supported in the case; a rotor that is fixed to the shaft; a stator that is constituted by: a stator core that is fixed to an inner wall surface of the case; and a stator coil that is configured by winding conducting wire onto the stator core; and a rectifier apparatus that is disposed inside the case and that is electrically connected to the stator coil so as to rectify alternating current generated in the stator coil into direct current, the rectifier apparatus having: a heatsink; a plurality of diodes that are fixed to the heatsink; and a circuit board that connects the diodes and the stator coil electrically and that is fixed to the case so as to be supported together with the heatsink by mount portions at least two points, the alternator being characterized in that: a vibration suppressing portion that is thicker than the mount portions and that suppresses generation of a vibrational mode in the circuit board between the two points is disposed on at least one of the mount portions.

Using an alternator according to the present invention, vibration between the mount portions of the circuit board can be suppressed by a simple construction without increasing size.

DETAILED DESCRIPTION OF THE PREFERRED EMBODIMENT

Embodiment 1

Figure 1:
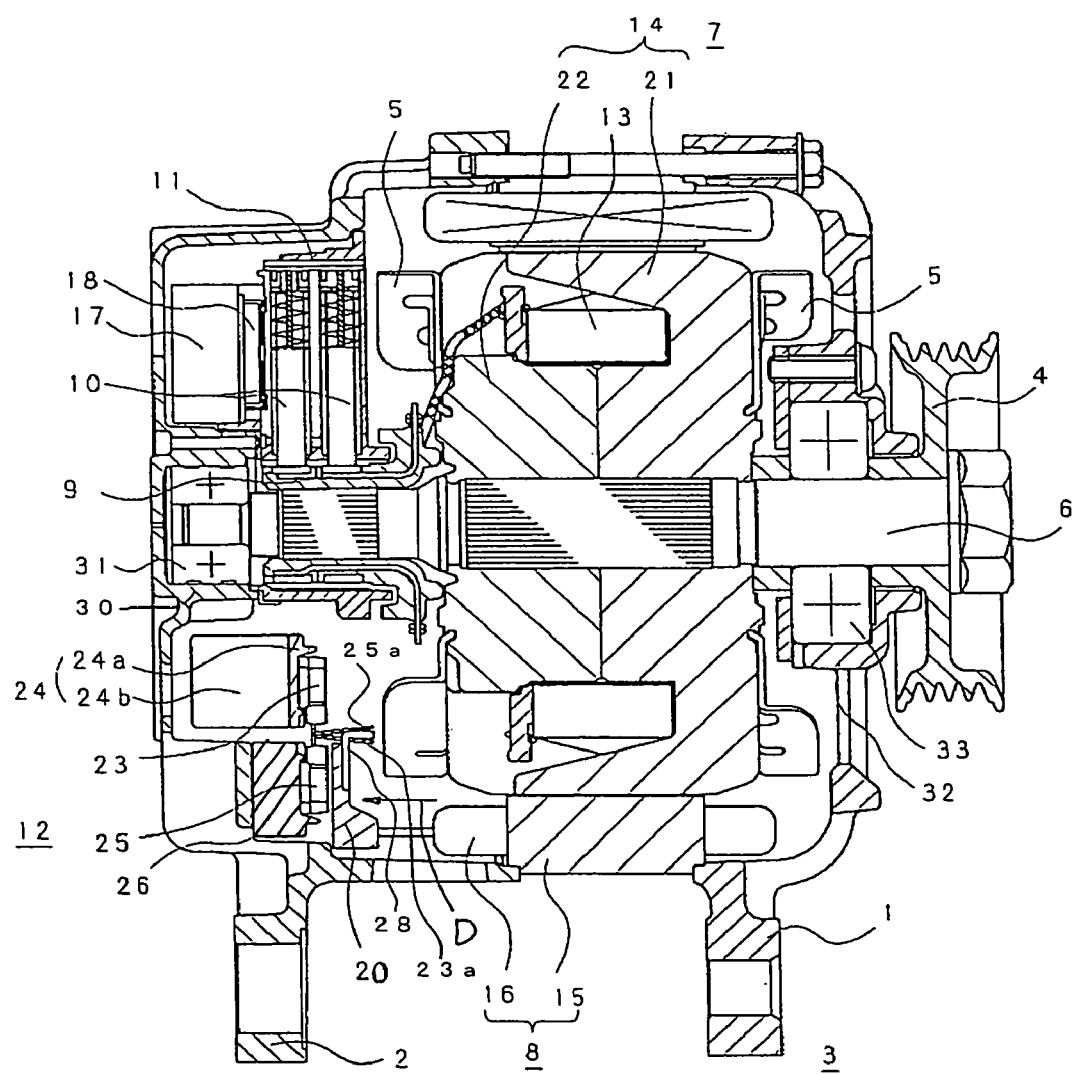
FIG. 1 is a cross section of an automotive alternator according to Embodiment 1 of the present invention.

Embodiment 1 of the present invention will now be explained based on drawings, and identical or corresponding members and portions in the drawings will be given identical numbering.

Figure 2:
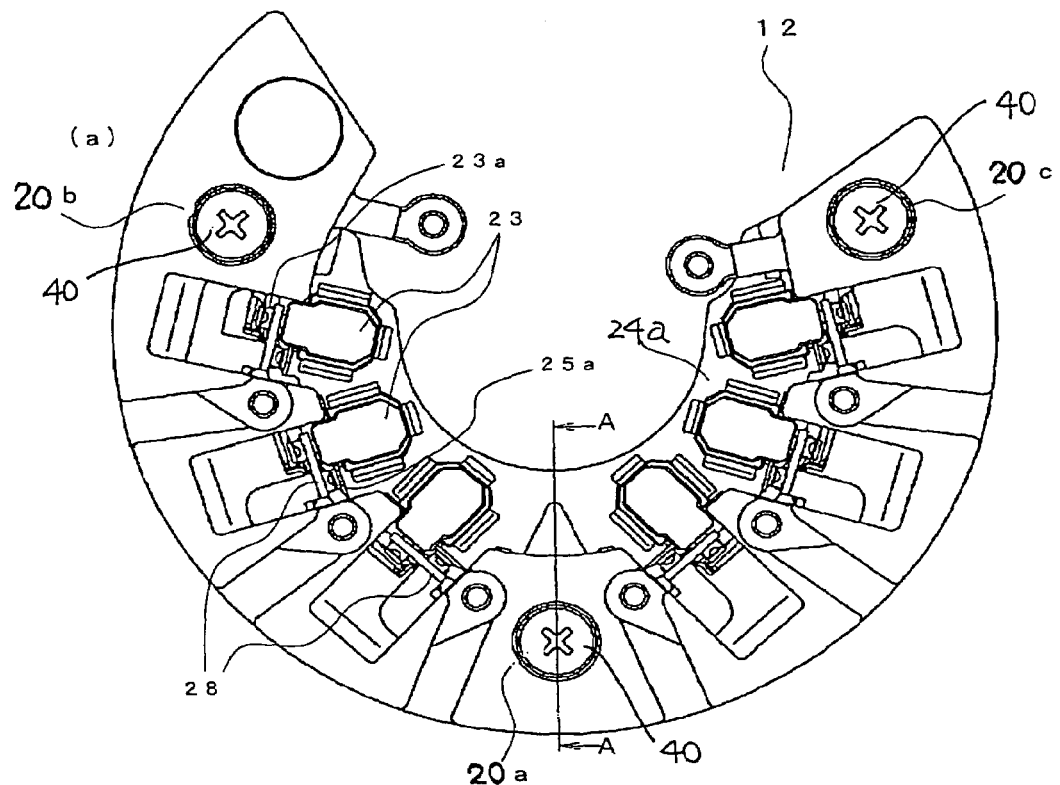
FIG. 2 is a general view of a rectifier apparatus from FIG. 1 when viewed in a direction of arrow D in FIG. 1.

FIG. 1 is a cross section of an automotive alternator according to Embodiment 1 of the present invention and FIG. 2 is a front elevation of a rectifier apparatus 12 when viewed in a direction of arrow D in FIG. 1.

This automotive alternator includes: a case 3 that is constituted by a rear bracket 2 and a front bracket 1 that are made of aluminum; and a shaft 6 that is rotatably supported by a rear bearing 31 that is fitted into a bearing housing portion 30 of the rear bracket 2 and a front bearing 33 that is fitted into a bearing housing portion 32 of the front bracket 1, and that has a pulley 4 fixed to a first end portion.

The automotive alternator also includes: a Lundell rotor 7 that is fixed to the shaft 6; a stator 8 that is fixed to an inner wall surface inside the case 3; slip rings 9 that are fixed to a second end portion of the shaft 6 so as to supply electric current to the rotor 7; a pair of brushes 10 that slide on the slip rings 9; a brush holder 11 that houses the brushes 10; a rectifier apparatus 12 that is electrically connected to the stator 8 so as to rectify alternating current that is generated in the stator 8 into direct current; a heatsink 17 that is fitted onto the brush holder 11; and a regulator 18 that is bonded to the heatsink 17 and that adjusts alternating voltage that is generated in the stator 8.

The rotor 7 includes: a rotor coil 13 that generates magnetic flux on passage of an electric current; and a pole core 14 that is disposed so as to cover the rotor coil 13 and in which magnetic poles are formed by the magnetic flux. The pole core 14 is constituted by a first pole core body 21 and a second pole core body 22 that alternately intermesh with each other. Centrifugal fans 5 for cooling are welded to axial end surfaces of the first pole core body 21 and the second pole core body 22, respectively.

The stator 8 includes: a stator core 15; and a stator coil 16 in which conducting wires are wound onto the stator core 15 such that an alternating current arises due to changes in the magnetic flux from the rotor coil 13 accompanying rotation of the rotor 7.

The rectifier apparatus 12 includes: a positive-side heatsink 24 that is constituted by an arc-shaped heatsink main body 24a and a plurality of fins 24b that are disposed upright on a rear surface of the heatsink main body 24a; positive-side diodes 23 that are fixed by soldering to a front surface of the heatsink main body 24a and molded in a resin; an arc-shaped negative-side heatsink 26 that is in surface contact with the rear bracket 2 and grounded; negative-side diodes 25 that are fixed by soldering to the negative-side heatsink 26 and molded in a resin; and a circuit board 20 that connects each of the diodes 23 and 25 and the stator coil 16 electrically, and three-phase alternating current that is generated in the stator 8 is rectified into direct current.

The positive-side heatsink 24 and the negative-side heatsink 26 are housed inside the case 3 so as to be disposed in a generally planar shape radially. The positive-side heatsink 24 and the negative-side heatsink 26 are made of aluminum that has a high coefficient of thermal conductivity.

The circuit board 20 holds terminals 28 that have a desired shape in an insulating resin, and has an arc strip shape similar to that of the negative-side heatsink 26 and the positive-side heatsink 24. The circuit board 20, the positive-side heatsink 24, and the negative-side heatsink 26 are positioned so as to be axially adjacent to each other.

A plurality of positive-side diodes 23 are disposed so as to be spaced apart circumferentially on the heatsink main body 24a of the positive-side heatsink 24. A plurality of negative-side diodes 25 are disposed so as to be spaced apart circumferentially on a surface of the negative-side heatsink 26 near the circuit board 20.

Respective leads 25a and 23a of the negative-side diodes 25 and the positive-side diodes 23 extend toward the circuit board 20.

A first mount portion 20a, a second mount portion 20b, and a third mount portion 20c are formed at a uniform pitch on the circuit board 20.

Figure 3:
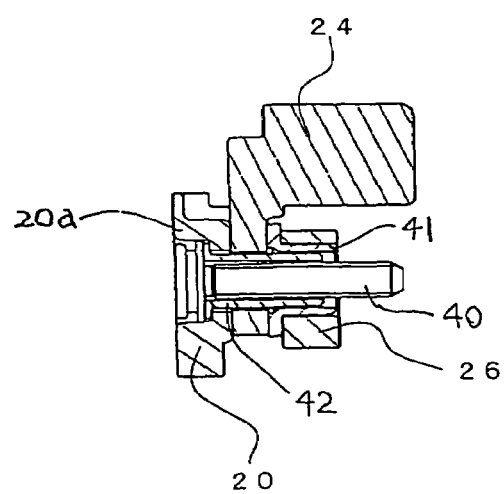
FIG. 3 is a cross section that is taken along line A-A in FIG. 2 and is viewed in the direction of the arrows.

FIG. 3 is a cross section that is taken along line A-A at the first mount portion 20a in FIG. 2 and is viewed in the direction of the arrows.

A flange of a cylindrical first insulating member 41 is interposed between the negative-side heatsink 26 and the positive-side heatsink 24. A cylindrical second insulating member 42 that has a flange passes through the first insulating member 41, an aperture of the positive-side heatsink 24, and an aperture of the first mount portion 20a.

The second mount portion 20b and the third mount portion 20c also have cross-sectional configurations similar to that of the first mount portion 20a.

The circuit board 20, the positive-side heatsink 24, and the negative-side heatsink 26 are integrated by using the first insulating member 41 and the second insulating member 42 in this manner.

A rectifier apparatus 12 that has been integrated in this manner is fixed to the rear bracket 2 by passing screws 40 through the respective second insulating members 42 and screwing the screws 40 into the rear bracket 2.

Figure 4:
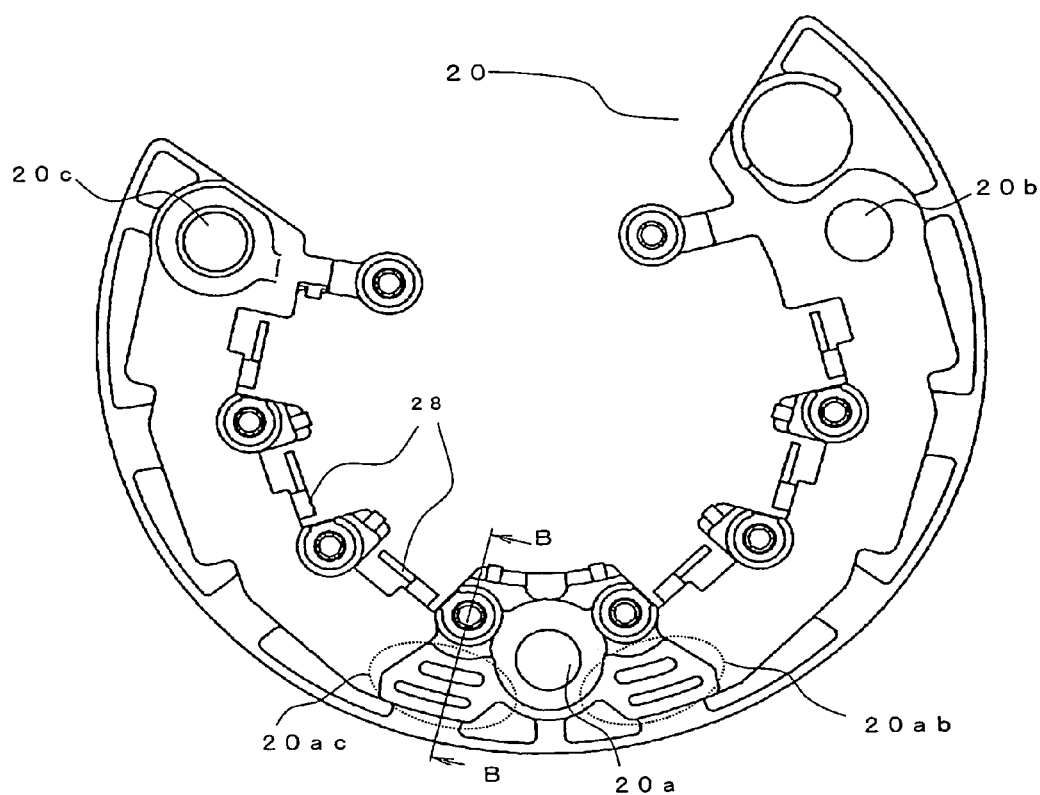
FIG. 4 is a plan of a circuit board from FIG. 1.
Figure 5:
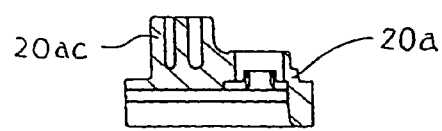
FIG. 5 is a cross section that is taken along line B-B in FIG. 4 and is viewed in the direction of the arrows.

FIG. 4 is a rear elevation of the circuit board 20 of the rectifier apparatus 12 that is shown in FIG. 2 when viewed from a rear side, and FIG. 5 is a cross section that is taken along line B-B in FIG. 4 and is viewed in the direction of the arrows.

Figure 6:
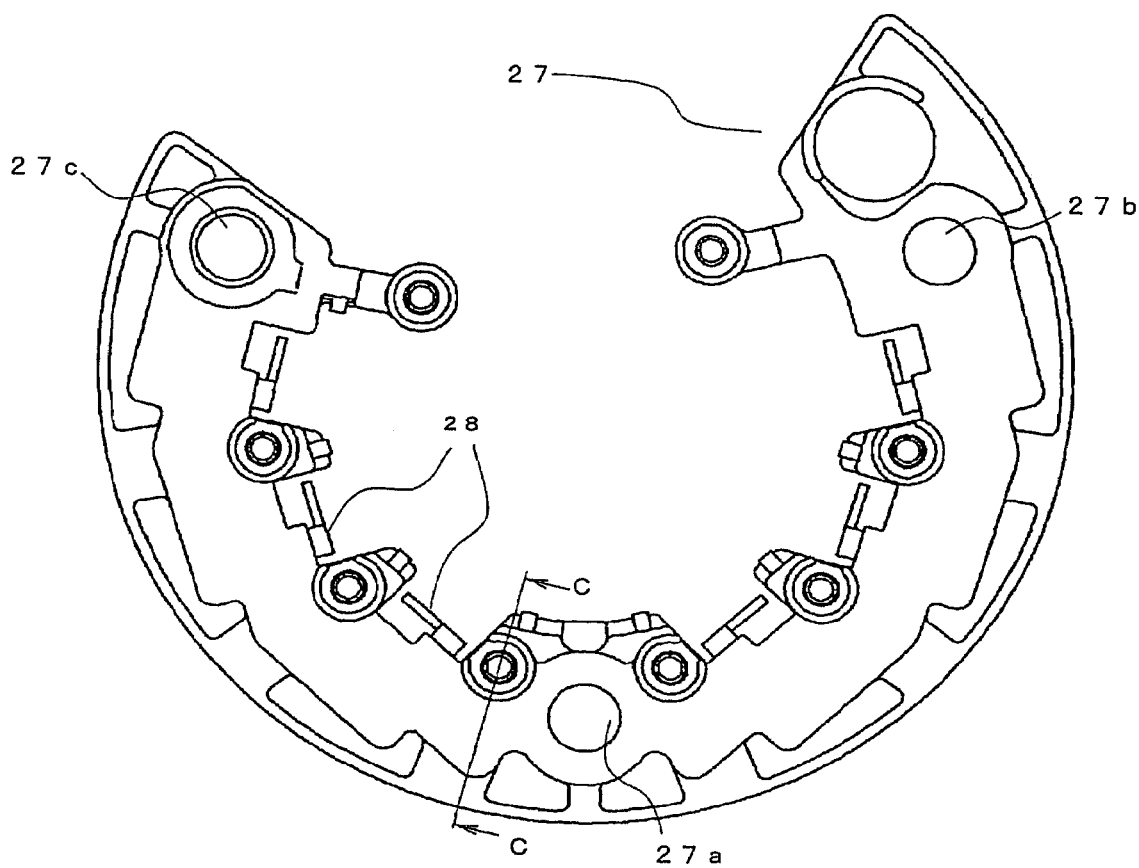
FIG. 6 is a plan of an example of a conventional circuit board.
Figure 7:
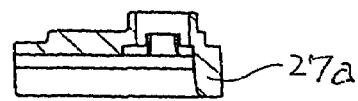
FIG. 7 is a cross section that is taken along line C-C in FIG. 6 and is viewed in the direction of the arrows.

FIG. 6 is a rear elevation of a conventional circuit board 27 when viewed from a rear side, as a reference example, and FIG. 7 is a cross section that is taken along line C-C in FIG. 6 and is viewed in the direction of the arrows.

Compared to the conventional circuit board 27, two vibration suppressing portions 20ab and 20ac that are thicker than the first mount portion 20a are formed on two sides of the first mount portion 20a of the circuit board 20 according to Embodiment 1. The two vibration suppressing portions 20ab and 20ac have identical shapes.

In an automotive alternator that has the above configuration, an electric current is supplied from a battery (not shown) through the brushes 10 and the slip rings 9 to the rotor coil 13, generating magnetic flux and giving rise to North-seeking (N) poles and South-seeking (S) poles, respectively, in the claw-shaped magnetic poles of the first pole core body 21 and second pole core body 22.

At the same time, since the pulley 4 is driven by an engine and the rotor 7 is rotated by the shaft 6, a rotating magnetic field is applied to the stator core 15, giving rise to electromotive force in the stator coil 16.

Magnitude of the alternating-current electromotive force is adjusted by the regulator 18, which adjusts current flowing to the rotor 7. Alternating current that is generated by the alternating-current electromotive force also passes through the rectifier apparatus 12 and is rectified into direct current, and the battery is charged.

In an automotive alternator according to this embodiment, two vibration suppressing portions 20ab and 20ac are disposed on two sides of the first mount portion 20a.

Figure 8:
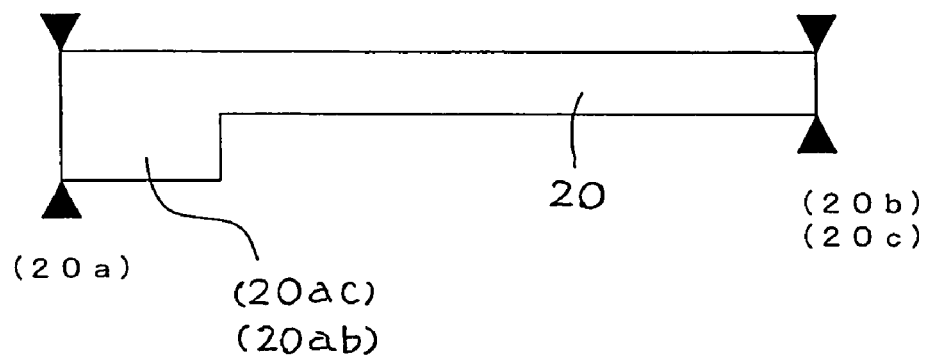
FIG. 8 is a model diagram of when two end portions of the circuit board from FIG. 4 are bridge-supported.

Consequently, since supported ends of the vibration suppressing portions 20ab and 20ac at the first mount portion 20a that supports the circuit board 20 extend toward the second mount portion 20b and the third mount portion 20c, as shown in FIG. 8, vibrational modes of the circuit board 20 between the first mount portion 20a and the second mount portion 20b and between the first mount portion 20a and the third mount portion 20c are suppressed.

Figure 9:
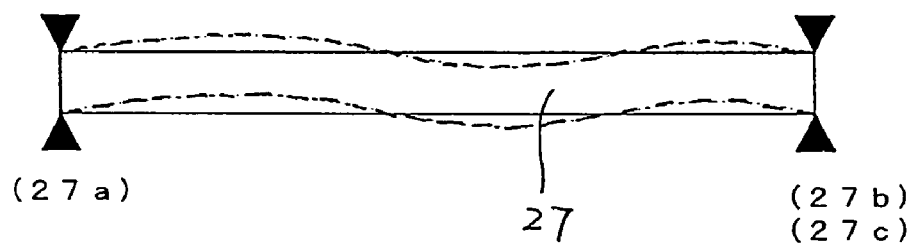
FIG. 9 is a diagram of a vibrational mode when two end portions of the circuit board that is shown in FIG. 6 are bridge-supported.

Moreover, FIG. 9 shows vibrational modes between a first mount portion 27a and a second mount portion 27b and between the first mount portion 27a and a third mount portion 27c in the circuit board 27 from FIGS. 6 and 7 that constitutes a conventional example.

The vibration suppressing portions 20ab and 20ac are configured integrally into the circuit board 20, enabling reliability of the rectifier apparatus 12 to be improved without increasing the number of parts.

Since the vibration suppressing portions 20ab and 20ac can be configured simply by increasing thickness partially at an existing first mount portion 20a, and the vibration suppressing portions 20ab and 20ac make use of an empty spatial region that was already present, it is not necessary to make the rectifier apparatus 12 larger axially or radially.

Moreover, either one of the vibration suppressing portions 20ab and 20ac may also be used singly.

A vibration suppressing portion may also be disposed on the second mount portion 20b or the third mount portion 20c.

By forming the vibration suppressing portions 20ab and 20ac longer toward the second mount portion 20b or the third mount portion 20c, the length of the respective antinode can be shortened between the first mount portion 20a and the second mount portion 20b or between the first mount portion 20a and the third mount portion 20c, which are in a bridge state, further suppressing vibration of the circuit board 20.

The vibration suppressing portions 20ab and 20ac may also be connected to each other on a radially-outer side.

Moreover, in the above embodiment, an explanation has been given for an automotive alternator, but the present invention can of course also be adapted to other alternating-current generators that are driven to rotate using an engine other than a vehicle-mounted engine, or an electric motor, a water wheel, etc., as a driving source.

What is claimed is:

1. An alternator comprising:
    a case;
    a shaft that is rotatably supported in said case;
    a rotor that is fixed to said shaft;
    a stator that is constituted by:
        a stator core that is fixed to an inner wall surface of said case; and
        a stator coil that is configured by winding conducting wire onto said stator core; and
    a rectifier apparatus that is disposed inside said case and that is electrically connected to said stator coil so as to rectify alternating current generated in said stator coil into direct current,
    said rectifier apparatus having:
        a heatsink;
        a plurality of diodes that are fixed to said heatsink; and
        a circuit board that connects said diodes and said stator coil electrically and that is fixed to said case so as to be supported together with said heatsink by mount portions at at least two points,
    wherein a vibration suppressing portion that is thicker than said mount portions and that suppresses generation of a vibrational mode in said circuit board between said two points is disposed on at least one of said mount portions;
    wherein the vibration suppressing portion is a first vibration suppressing portion, wherein the alternator further comprises a second vibration suppressing portion that is thicker than said mount portions and that suppresses generation of a vibrational mode in said circuit board between said two points, and wherein the first vibration suppressing portion is positioned on one side of a first mount portion and the second vibration suppressing portion is positioned on an opposite side of the first mount portion; and
    wherein the first vibration suppressing portion and the second vibration suppressing portion connect to each other on a radially-outer side of the circuit board.

2. The alternator according to claim 1, wherein the first vibration suppressing portion and the second vibration suppressing portion extend longitudinally towards adjacent mount portions.

3. The alternator according to claim 1, wherein the first vibration suppressing portion and the second vibration suppressing portion have the same shape.

* * * * *